US010959342B2

(12) United States Patent
Williams

(10) Patent No.: US 10,959,342 B2
(45) Date of Patent: Mar. 23, 2021

(54) CONDENSATION RESISTANT POWER SEMICONDUCTOR MODULE

(71) Applicant: Kevin R. Williams, Waller, TX (US)

(72) Inventor: Kevin R. Williams, Waller, TX (US)

( * ) Notice: Subject to any disclaimer, the term of this patent is extended or adjusted under 35 U.S.C. 154(b) by 9 days.

(21) Appl. No.: 16/377,637

(22) Filed: Apr. 8, 2019

(65) Prior Publication Data

US 2020/0323092 A1 Oct. 8, 2020

(51) Int. Cl.
| H05K 5/06 | (2006.01) |
| H05K 5/02 | (2006.01) |
| H01L 23/50 | (2006.01) |
| H01L 23/10 | (2006.01) |
| H05K 7/20 | (2006.01) |
| H01L 23/367 | (2006.01) |

(52) U.S. Cl.
CPC ............ *H05K 5/0239* (2013.01); *H01L 23/10* (2013.01); *H01L 23/3672* (2013.01); *H01L 23/50* (2013.01); *H05K 5/06* (2013.01); *H05K 7/2089* (2013.01)

(58) Field of Classification Search
CPC .................................................... H05K 5/0239
USPC .......................................................... 174/520
See application file for complete search history.

(56) References Cited

U.S. PATENT DOCUMENTS

| 6,680,856 B2 | 1/2004 | Schreiber |
| 7,324,359 B2 | 1/2008 | Schreiber |
| 8,026,699 B2 | 9/2011 | Schreiber |
| 2003/0214770 A1 | 11/2003 | Schimanek et al. |
| 2004/0245548 A1 | 12/2004 | Stockmeier et al. |
| 2008/0007973 A1 | 1/2008 | Schreiber |
| 2016/0049342 A1* | 2/2016 | Rahimo ................ H01L 25/115 257/682 |
| 2019/0185659 A1* | 6/2019 | Yoshida ................. C08L 67/02 |

FOREIGN PATENT DOCUMENTS

EP          1 544 915    * 12/2004    ............. H01L 23/40

OTHER PUBLICATIONS

Semikron, Technical Explanation SKiiP 4, Sep. 2017, Semikron, p. 5 (Year: 2017).*

* cited by examiner

*Primary Examiner* — Stanley Tso
(74) *Attorney, Agent, or Firm* — Egbert, McDaniel & Swartz, PLLC

(57) ABSTRACT

A power semiconductor module has a base plate, a housing affixed to the base plate, a DC busbar affixed to the base plate and the housing, and AC busbar affixed to the base plate and the housing, control electronics positioned in an interior of the housing and connected to the AC and DC busbars, and a sealant material applied to seams between the base plate in the housing, to seams between the DC busbar and the housing, and to seams between the AC busbar in the housing. The sealant material is applied such that the control electronics of the power semiconductor modules are in an air-tight environment.

1 Claim, 4 Drawing Sheets

CONDENSATION RESISTANT POWER SEMICONDUCTOR MODULE

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present invention relates to power semiconductor modules. More particularly, the present invention relates to power semiconductor modules that are used in association with wind farms converters, drilling rig VFD systems, marine propulsion VFD systems, fracking pump VFDs, and other VFD and/or regenerative power applications involving IGBTs. Additionally, the present invention relates to power semiconductor modules such as the Skiip 4 of Semikron.

2. Description of Related Art Including Information Disclosed Under 37 CFR 1.97 and 37 CFR 1.98

The application of power semiconductor modules and power converter circuits is often applied in applications, such as wind energy, where the current produced by the generators is temporarily variable. For power outputs of up to one megawatt and more, generators with up to 690 volts are used. This means that the voltage in the intermediate circuit, or in the DC connection to the power converter, lies in about 1000 to 1100 volts. In the associated power converter circuits, IGBTs (insulated gate bipolar transistors) are often used as power switches and their associated silicon voltage are 1200 volts or 1700 volts depending on the system AC voltage. However, these intermediate circuit voltages of 1100 volts are too low for higher power outputs. Since transmission losses increase as the square of the current, higher voltages, which reduce the current, reduce losses. The lower voltages of 1100 volts or so result in excess losses, for example in power lines. For that reason, medium-voltage generators of the standardized voltage classes of 2.2 kV, 3.3 kV, 4.16 kV and 6.3 kV are used in power generation with outputs starting in about six (6) megawatts. The resulting high intermediate circuit voltages require high-voltage power switches such as IGBTs or IGCTs (integrated gate commutative thyristors). However, these high-voltage versions have the disadvantage that power losses are higher by a factor of 3 to 10 in comparison with the standard versions.

The generators used for the above-mentioned technologies are asynchronous machines. These robust generators require four-quadrant converters, since for excitation, these generators need an input current which regulated via the four-quadrant transformation. A particular product that has shown success in association with wind farms and the production of large amounts of energy from wind energy generators is the Skiip 4 of Semikron. The Skiip 4 is an intelligent power module with the highest power density and reliability. This intelligent integrated power module means that three perfectly matched components are integrated into one integrated power module. These components include the heatsink, the power section and the gate driver. The power section can include three half-bridge modules in parallel, four half-bridge modules in parallel, or six half-bridge modules in parallel. The chips themselves are sintered, not soldered. The sintering is based on pulverized silver which forms a material connection when pressure and temperature are applied. This sintering process connects the chip and DCB surface and is extremely stable up to the melting point of silver at 962° C. Contact springs are used for all of the auxiliary contacts (gate, auxiliary emitter and temperature sensor). These spring contacts allow the solder-free connection of the driver board. The task of the gate driver is both to transfer incoming signals into powerful output signals in order to control the IGBT and to ensure signal isolation between high and low voltage sides of the driver board.

FIGS. 1 and 2 are illustrations of the prior art Skiip 4 of Semikron. As can be seen in FIGS. 1 and 2, the power semiconductor module 10 has a base plate 12 and a housing 14 affixed to the base plate. A lid 16 is affixed to the housing 14 at the top thereof. The lid 16 has a plurality of holes 18 that open therethrough and into the interior of the housing 14. The control electronics are located within the interior of the housing. A DC busbar 20 is affixed to the base plate 12 and affixed to the housing 14. The control electronics are connected to the DC busbar 20. A plurality of supports 22 extend upwardly from the base plate 12 and support the DC busbar 20. A plurality of bays 24 are located between the plurality of supports 22 and the DC busbar. A connector 26 is located at the top of the lid 16 and supports a connector 26 for connection to the control electronics.

FIG. 2 shows that there is an AC busbar 28 located on the side of the housing 14 opposite the DC busbar 20. Heatsink mountings 30 are positioned on the base plate 12 and support the AC busbar 28. The heatsink mountings 30 serves to transfer heat away from the control electronics. If necessary, water can flow through the heatsink mounting 30 so as to provide a cooling effect. The plurality of holes 32 are also formed on the lid 16 and open to the interior of the housing 14 and the control electronics. Various plugs 34 are also mounted to the side of the housing 14.

In the illustrations of FIGS. 1 and 2, the Skiip 4 has several openings to the interior of the housing. It was felt necessary, in the prior art, to provide these openings so as to allow an airflow to the control electronics. This is important because of the high capacity of the electronics connected to the control electronics within the interior of the power semiconductor module. In particular, in normal use, the IGBTs will create a great deal of heat. It was felt in the prior art that if this heat were not removed by airflow, then this heating of the IGBTs could shorten the life of the IGBTs and hence the power semiconductor module. Specifically, airflow openings are formed in the seams between the housing 14 and the base plate 12, through the holes 18, through the holes 32, through the seams between the AC side heatsink mountings, through the seams around the hole of the connector 26, and through various other seams and openings. Unfortunately, whenever the ambient air enters the interior of the power semiconductor module 10, there is the possibility of condensation occurring within the power semiconductor module. Also condensation appears on the heat sink due to the relative humidity and delta temperature of coolant and ambient heat plate temperature.

It is generally known that water causes problems with electrical circuits due to its electrical conductivity and corrosive nature. What is less commonly known is the effect that water has on electronics when in its gaseous state (i.e. water vapor). This vapor is diffused into the surrounding air and behaves according to the temperature and pressure of the atmosphere in a given volume. The presence of water vapor in the air is referred to as humidity and is defined as either absolute humidity, relative humidity, or air (dry) temperature. When water vapor present in air changes state from a gas into a liquid, it forms condensation on surfaces. The temperature at which condensation occurs is called the dew point and varies with the relative humidity. There is a relationship between relative humidity, air temperature, and dew point based upon a magnus equation approximation. For a given pressure and humidity, the temperature of the volume of air (or object) drops below the dew point, condensation will occur in that area. As a commonly used example, consider a room with a 20° C. air temperature and a measured relative humidity of 60%. A chilled bottle of water (for example, 5° C.) taken from a refrigerator and brought into the room will have water droplets condense on its sides. The chilled bottle cools the air in its immediate vicinity to below the dew point. Any parcel of air in this environment that is cooled below 12° C. will cause the moisture it contains to condense into liquid.

Once water vapor has condensed into a liquid, the effects on electronics are quite obvious. Droplets of water forming on a heatsink may wick into the housings of the power modules. In the case of live conductors, such as in laminated DC link busplates or the DCB, liquid can compromise the voltage withstand of the insulation material. Evidence of past condensation can possibly be seen in the form of watermarks. However, it is often impossible to determine if condensation was present if the water has evaporated entirely. It is known that condensation can occur and ultimately cause a failure in the power semiconductor module and, possibly, an explosion. As such, various steps have been taken so as to assure that the condensation cannot result in disastrous effects. For example, certain condensation mitigation techniques can include the use of cabinet heaters. Industrial cabinet heaters are commercially available to facilitate the increase of the ambient (dry) air temperature so as to decrease relative humidity. In particular, the cabinet heaters dry the cabinet after initial commissioning. They drive humidity out of a closed system by using one-way permeable membranes. They prevent condensation from forming on internal cabinet walls/sealants. They prevent condensation on internal metal parts when the external ambient temperature gets hotter. It is necessary to preheat the electrical cabinet prior to operation and to protect the electronics during operation and low ambient temperatures. The heater can be controlled by a hygrostat to ensure that the temperature inside the cabinet does not fall below the dew point.

In the event that condensation occurs, there is a long period of drying out time. Typically, this drying out period can be 24 hours. During this drying out period, all of the electrical production will cease.

Recent statutes and regulations have required a drying out procedure whenever the wind energy generator is off-line for a period of time or a drilling rig is moved from one location to another. As such, in a situation where the wind energy generators must be shut down because of a power overload, startup is delayed until condensation can be removed from the interior of the power semiconductor modules. As such, this greatly delays startup procedures and the production of revenue-generating power. Furthermore, the drying out procedures can be quite complicated. Once again, it may be necessary for skilled personnel to become involved in order to properly assure that condensation has not occurred within the power semiconductor module. Ultimately, if condensation occurs, then the power semiconductor can be damaged to the point of needing to be replaced or can possibly result in an explosion and a dangerous situation. As such, need has developed so as to provide a power semiconductor module that avoids any possibility of condensation on the interior thereof.

In the past, various patents have issued to Semikron with respect to such power semiconductor modules. In particular, U.S. Pat. No. 6,680,856, issued on Jan. 20, 2004 to D. Schreiber, teaches a power converter circuit arrangement for generators with dynamically variable power output. In particular, this power converter circuit is for wind power devices which feed into a high-voltage grid consisting of a power converter circuit arrangement to transform the variable frequency and variable voltage alternating current generated in the AC voltage generator into DC. The DC is chopped to again produce AC but with a fixed frequency and voltage. The power converter has a cascaded serial arrangement of several power converter cells. The power converter cells are made dynamically active or inactive by the master control unit, depending on the power being generated by the AC voltage generator.

U.S. Pat. No. 7,324,359, issued on Jan. 29, 2008 to D. Schreiber, teaches a converter circuit for a wind power system for supplying a high-voltage direct voltage connection. This system includes a transformer with one primary winding per phase and a plurality of secondary windings per phase. Each of the secondary windings of different phases are connected to each rectifier cell. These rectifier cells are connected to one another by their inputs and outputs. The rectifier cells themselves each include one input rectifier and two series-connected upward converters, and the center tap of the secondary winding of the transformer is connected to the center points of the series circuit of the upward converters.

U.S. Pat. No. 8,026,699, issued on Sep. 27, 2011 to D. Schreiber, shows a frequency converter circuit for a double-fed asynchronous generator with a variable power output, which can be connected to a voltage network containing a rotor rectifier and which can be connected to the rotor of the asynchronous generator. A network frequency converter is connected to the voltage network. An intermediate circuit contains a semiconductor switch arranged on the rotor rectifier, an intermediate circuit capacitor or arranged on the network frequency converter, and a diode arranged between the semiconductor switch and the intermediate circuit capacitor.

U.S. Patent Application Publication No. 2003/0214770, published on Nov. 20, 2003 to Schimanek et al., discloses a method and circuit arrangement with adaptive overload protection for power switching devices. Dynamic thresholds for power circuit switch operation are calculated in real-time using instantaneous operating parameter measurements. The dynamic thresholds are self-adapting and are used to provide shutdown criteria independent of switch control systems. A characteristics field containing information related to operation parameters is used to make overload evaluations in real-time. These dynamic overload evaluations allow complete protection against thermal overload for entire power circuits in addition to power components. The power circuit output profile can be modified in response to dynamic overload evaluation, thus preventing overload shutdown or damage to components, while operating at optimal efficiency.

U.S. Patent Application Publication No. 2004/0245548, published on Dec. 9, 2004 to Stockmeire et al., teaches a power semiconductor module that has a baseplate comprising a frame-like housing, a cap, and at least one electrically insulated substrate disposed inside the housing. The substrate comprises an insulation body with a plurality of metal connection tracks located thereon and insulated from one another. Power semiconductor components are located on the connection tracks. Terminal elements lead to the outside of the power semiconductor module for load and auxiliary contacts. Some of these terminal elements in the interior of the power semiconductor module comprise contact springs, which are disposed between the connection tracks and the contact points on a printed circuit board. The printed circuit board has conductor tracks which connect the contact points to the contact elements that lead to the outside of the power semiconductor module.

U.S. Patent Application Publication No. 2008/0009773, published on Jan. 10, 2008 to D. Schreiber, provides a power converter circuit for converting a multi-phase alternating current into a high-voltage direct voltage and then into a second multiphase alternating voltage. The circuit comprises first and second cascades of power converter cells, each cascade having first terminals on a transformer side and second terminals on a direct voltage side. The first cascade is a serial arrangement of first power converter cells. The second cascade is a serial arrangement of second power converter cells. Each second power converter cell is embodied with a three-phase bridge circuit connected by first terminals to a transformer and with an intermediate circuit.

It is an object of the present invention to provide a power semiconductor module that avoids condensation in the interior of the power semiconductor module.

It is another object to the present invention to provide a power semiconductor module that reduces downtime.

It is another object of the present invention provide a power semiconductor module that avoids explosions.

It is another object of the present invention to provide a power semiconductor module which avoids the need to apply heat and temperature manipulation for the removal of condensation.

It is another object of the present invention to provide a power semiconductor module that increases the lifespan of the power semiconductor module.

It is another object of the present invention to provide a power semiconductor module which avoids the use of environmentally controlled environments.

These and other objects and advantages of the present invention will become apparent from a reading of the attached specification and appended claims.

BRIEF SUMMARY OF THE INVENTION

The present invention is a power semiconductor module that comprises a baseplate, a housing affixed to the base plate, a DC busbar affixed to the baseplate and to the housing, an AC busbar affixed to the baseplate and to the housing, control electronics positioned on the interior of the housing and connected to the DC busbar and the AC busbar, and a sealant material applied to seams between the baseplate, the housing, the DC busbar, and the AC busbar. In particular, the sealant is applied to seams between the baseplate and the housing. The sealant material is applied to seams between the DC busbar, the housing and the baseplate. The sealant material is also applied to seams between the AC busbar, the housing and the baseplate. The sealant material is applied such that the control electronics are maintained at an air-tight environment within the housing.

The housing has a lid affixed to a top thereof. The sealant material is affixed to seal the seam between the lid and the housing. The lid also has a plurality of holes formed therein so as to open to the interior of the housing. The sealant material closes this plurality of holes. A heatsink mounting is affixed to the AC busbar. The sealant material is applied to the seam between the heatsink mounting and the AC busbar. A plurality of plugs are affixed to the housing adjacent to the AC busbar. The sealant material is applied to seams between the plurality of plugs and the housing. The DC busbar has a plurality of bays formed therein. The sealant material closes this plurality of bays. A connector is affixed to a top of the housing and is connected to the control electronics. The sealant material is applied to seams between the connector and the housing. In the preferred embodiment, the sealant material is a silicone material.

The present invention is also an improved power semiconductor module having a plurality of holes and seams that open to the control electronics. The improvement comprises a sealant material that is applied into the plurality of holes and seams so as to seal the plurality of holes and seams such that the control electronics are maintained at an air-tight environment. The power semiconductor module is a Skiip 4. The sealant material is a silicone material.

The present invention is also a method of sealing control electronics in an airtight environment within a power semiconductor module. This method includes the steps of: (1) filling holes of a housing of the power semiconductor module with a sealant material; (2) filling seams between the AC side heatsink sink mounting and the housing with the sealant material; (3) filling seams between the plugs adjacent to the AC busbar and the housing with the sealant material; (4) filling holes formed in a lid attached to the housing with the sealant material; (5) filling seams between shuttles adjacent to the AC busbar and the housing with the sealant material; (6) filling seams between the DC busbar and the housing with the sealant material; (7) filling seams between the DC busbar and the baseplate of the power semiconductor module with the sealant material; (8) filling seams between AC busbar and the housing with the sealant material; and (9) filling seams between the housing of the baseplate with the sealant material.

The method of the present invention further includes loading a syringe with the sealant material and ejecting the sealant material from the syringe into the seams and holes. A vacuum can be introduced into the interior of the power semiconductor module prior to the steps of filling. In particular, a screw is removed from a screw hole in the housing in a vacuum hose is introduced through the screw hole such that an end of the vacuum hose resides in the interior of the power semiconductor module. The vacuum hose is removed after the vacuum is applied. The screw hole is sealed after the vacuum hose is removed. The vacuum should be less than one p.s.i.

The method present invention further includes introducing a pressure through a hole into the interior of the power semiconductor module and then checking for leaks in the holes and seams filled with the sealant material. This hole is then sealed following the step of checking.

This foregoing Section is intended to describe, with particularity, the preferred embodiments of the present invention. It is understood that modifications to these preferred embodiments can be made within the scope of the present claims. As such, this Section should not to be construed, in any way, as limiting of the broad scope of the present invention. The present invention should only be limited by the following claims and their legal equivalents.

DETAILED DESCRIPTION OF THE INVENTION

Figure 3:
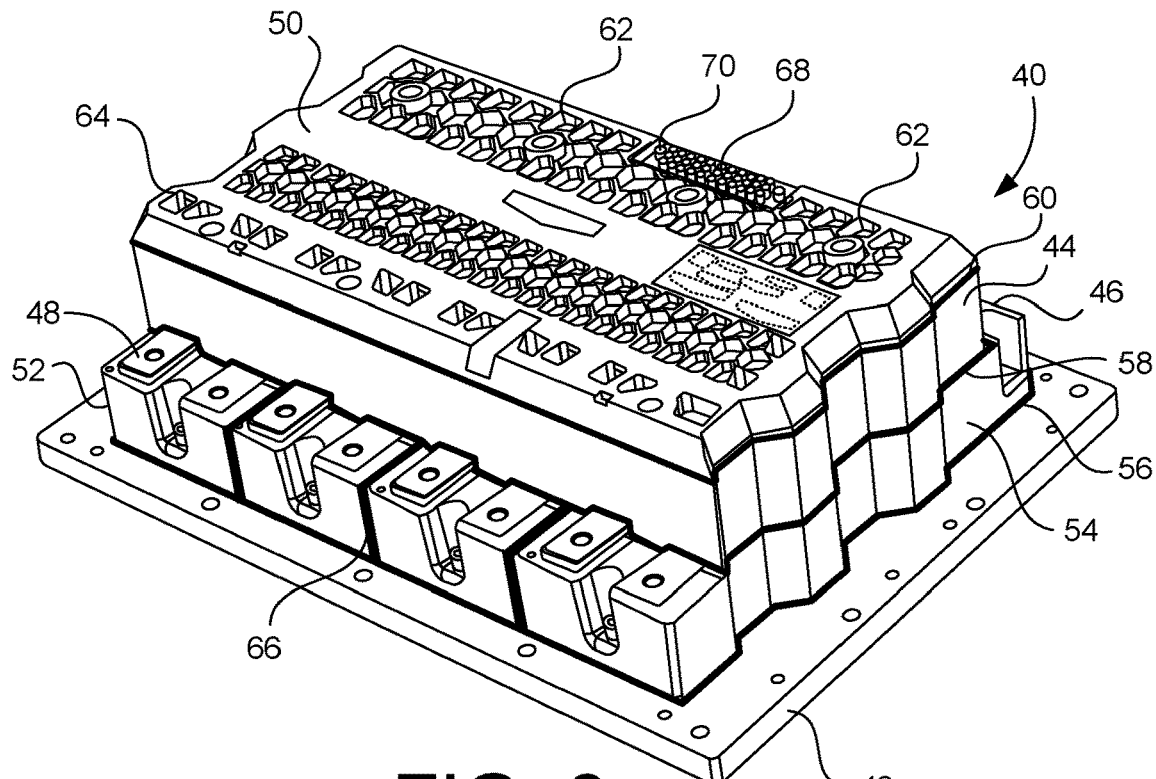
FIG. 3 is an upper perspective view from one side of the power semiconductor module in accordance with the present invention.

Referring to FIG. 3, there shown the power semiconductor module 40 in accordance with the teachings of the present invention. The power semiconductor module 40 includes a base plate 42, a housing 44, and AC busbar 46, and a DC busbar 48. A lid 50 and a plurality of supports 52 extend between the top of the baseplate 42 and the DC busbar 48. A heatsink 54 is located below the housing 46 and upon the baseplate 42.

In the present invention, a sealant material 56 is applied between the bottom of the heat sink 54 (or the bottom of the housing 44) and the top of the baseplate 42. The sealant material 50 should be applied the applied circumferentially around the bottom of the heatsink 54 or around the bottom of the housing 44. In FIG. 3, there is another sealant material 58 applied between the bottom of the housing 44 and the top of the heat sink 54. The sealant material 58 is also applied between the DC busbar 48 and the housing 44. The sealant material 56 and 58 is applied so that control electronics (located within the interior of the housing 44) are maintained in an air-tight environment. Another sealant material 60 is applied between the lid 50 and the top of the housing 44. Sealant material 60 extends circumferentially around the periphery of the lid 50. The lid 50 has a plurality of holes 62 formed therein which open to the interior of the housing 44 and to the control electronics. These holes 62 are also filled with the sealant material. Additional holes 64 are formed on the opposite side of the lid 50. Once again, sealant material is applied so as to cover these holes. The sealant material 66 is applied between the supports 52. A connector 68 is located at the top of the lid 50. A sealant material 70 also extends around the periphery of the connector 68 so as to seal any openings that might exist between the periphery of the connector 68 and the lid 50.

Figure 4:
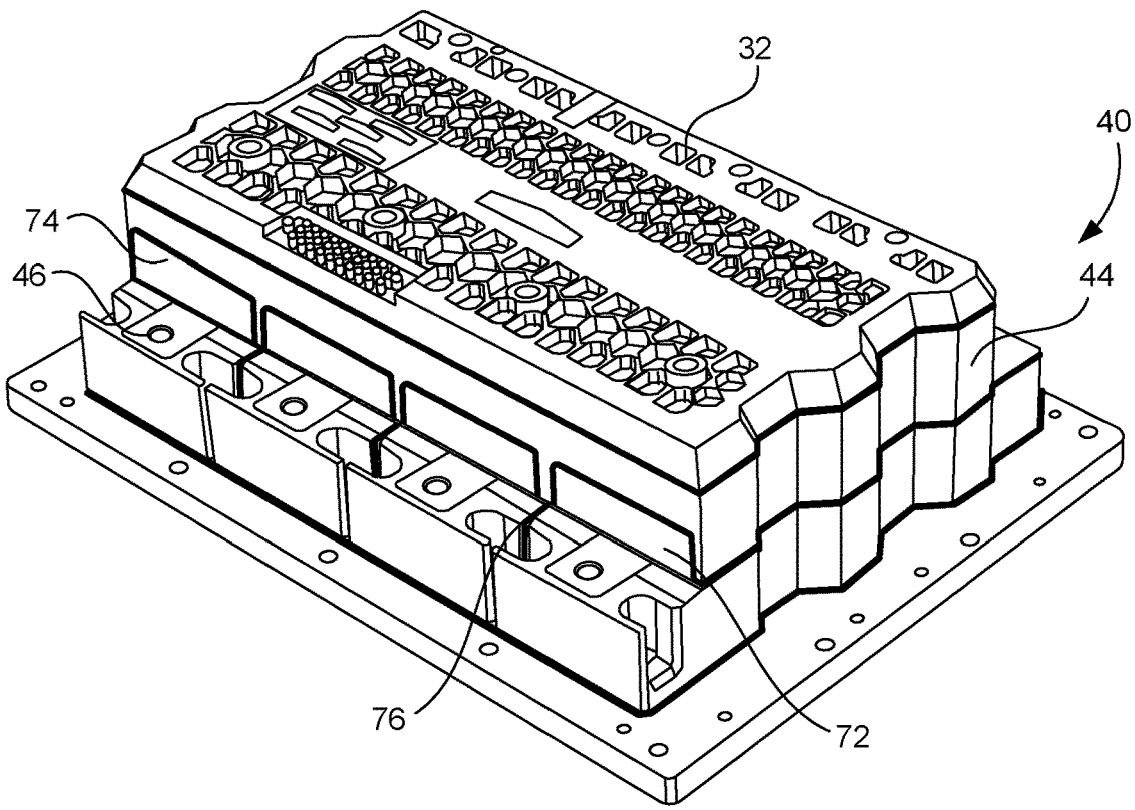
FIG. 4 is an opposite side upper perspective view of the power semiconductor module in accordance with the teachings of the present invention.

FIG. 4 is an opposite view of the power semiconductor module 40. In FIG. 4, the AC busbar 46 is particularly shown. Also, a plurality of plugs 72 are arranged on the side of the housing 44 adjacent to the AC busbar 46. Sealant material 74 is applied around the periphery of the plugs 72. Similarly, sealant material 76 is applied between the heatsink elements associated with the AC busbar 46. In other words, all openings to the interior of the power semiconductor modules 40 are sealed with the sealant material.

Figure 5:
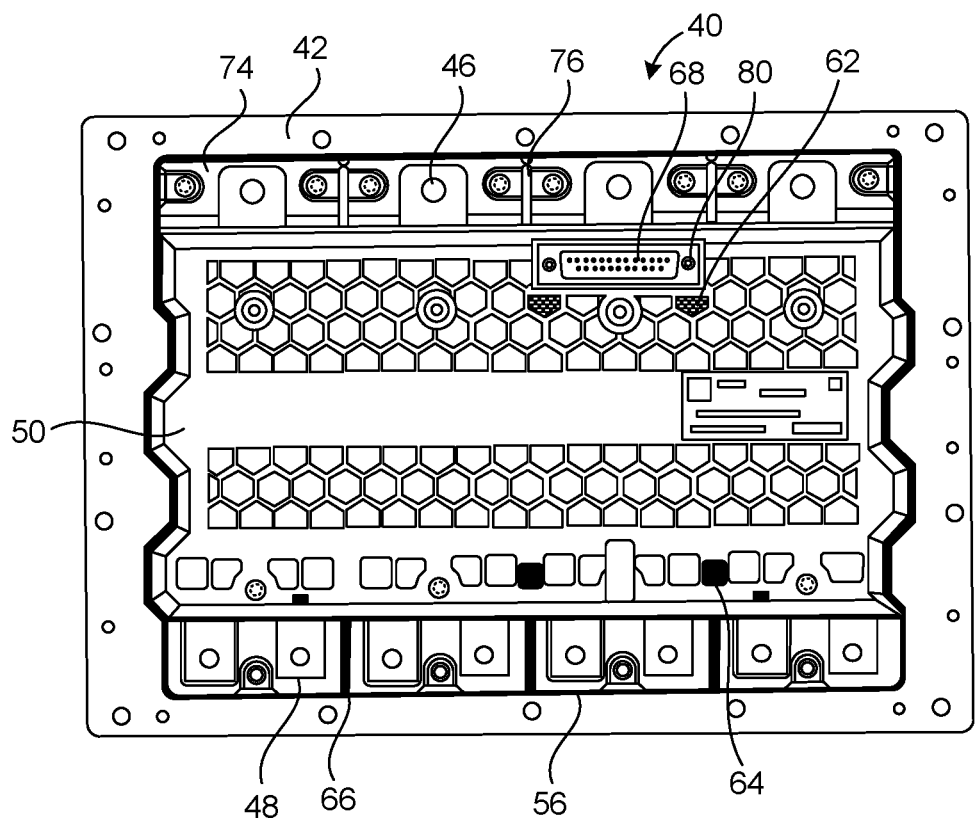
FIG. 5 is a plan view of the power semiconductor module of the present invention.

FIG. 5 is a plan view of the power semiconductor module 40. In particular, the baseplate 42 is illustrated. The lid 50 extends over the housing. FIG. 5 shows that the holes 64 are filled with the sealant material. Similarly, holes 62 are also filled with the sealant material. The sealant material 80 will extend around the periphery of the connector 68. The sealant material 66 is inserted in each of the bays of the DC busbar 48. The sealant material 56 extends around the bottom of the supports 52 at the baseplate 42. The AC busbar 46 is illustrated as having sealant material 76 extending between each of the elements of the AC busbar 74. As such, all of the components are effectively sealed.

Figure 6:
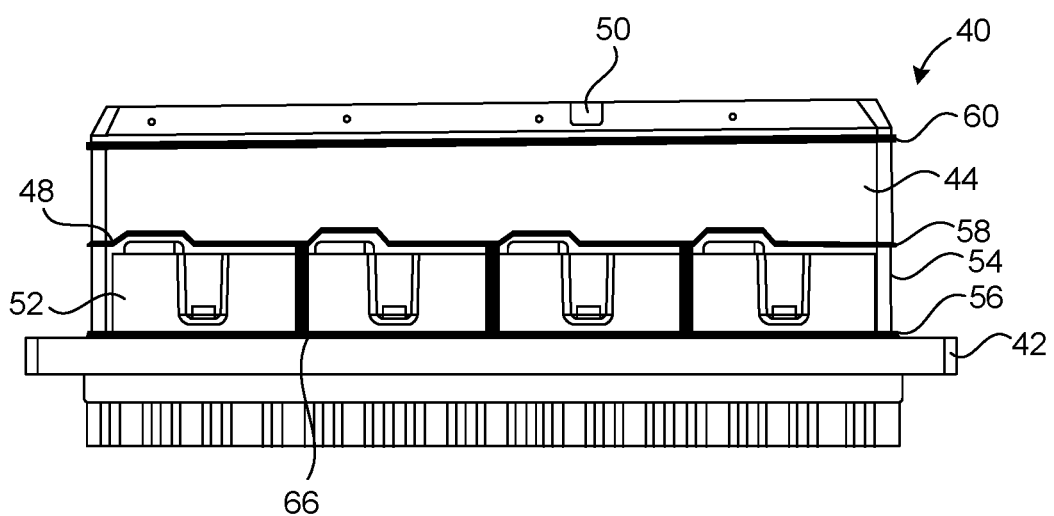
FIG. 6 is a side elevational view of the power semiconductor module of the present invention.

FIG. 6 shows a side view of the power semiconductor module 40 of the present invention. In particular, the DC busbar 48 is illustrated. The sealant material 66 extends between each of the supports 52 or heatsink for the DC busbar 48. Sealant 56 extends between the baseplate 42 and the bottom of the heatsink 54. Sealant 58 extends around the bottom of the housing 44 and the top of the heatsink 54. Sealant 60 extends between the top of the housing 44 and the lid 50.

Fundamentally, the sealant material used in the present invention seals all of the openings, seams, crevices and holes that may exist on the power semiconductor module 40. As such, the interior of the housing is sealed and the control electronics are maintained in an air-tight environment. As a result, absolutely no condensation can occur within the interior of the housing. The trade-off is that there is little ventilation to the control electronics provided by the present invention. In the past, it is believed that it is important to provide the holes and seams in the housing and the various other elements of the power semiconductor module so that adequate ventilation can interact with the IGBTs. In the present invention, there would be no such ventilation.

Figure 1:
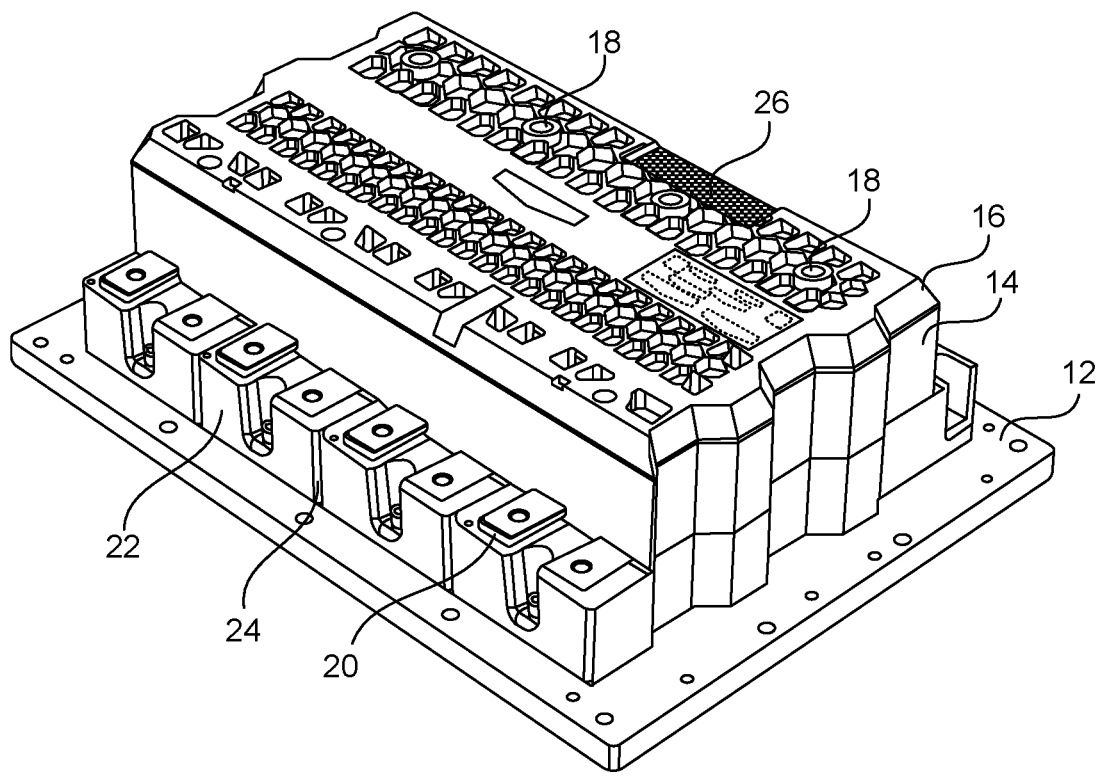
FIG. 1 is an upper perspective view from one side of a power semiconductor module of the prior art.
Figure 2:
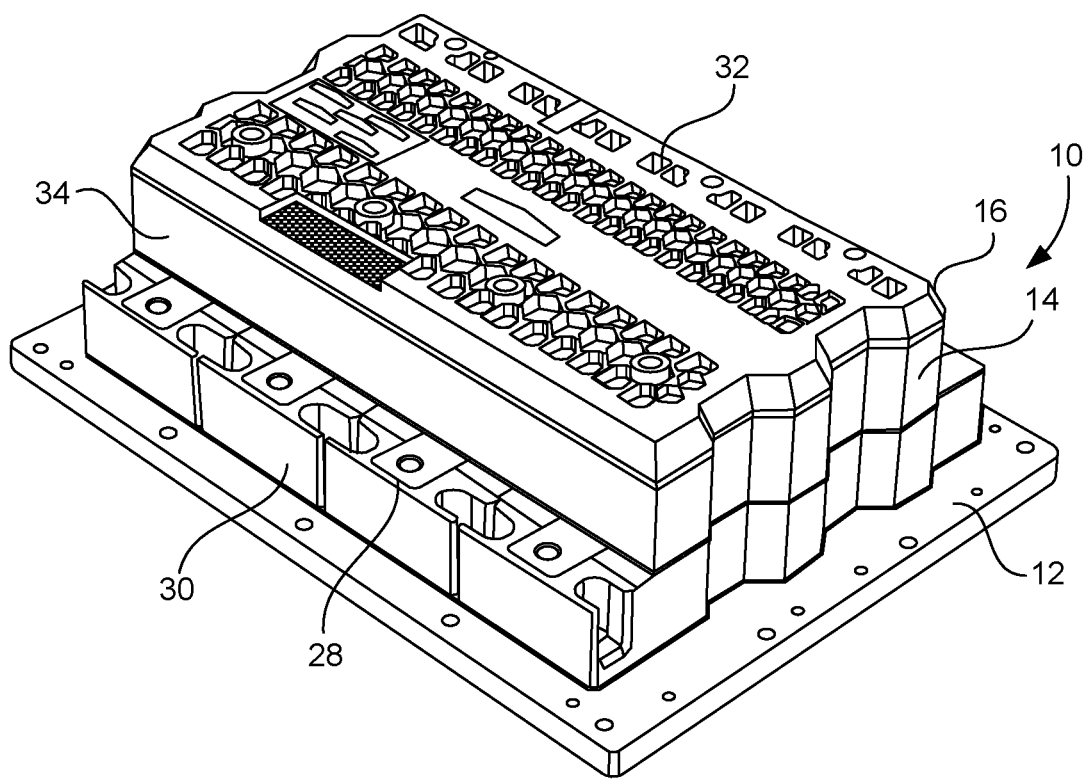
FIG. 2 is an opposite side upper perspective view of a power semiconductor module of the prior art.

Experiments with the present invention have shown that the power semiconductor module that of the present invention exhibits an incredibly long life span even in the most condensation-causing environments. In experiments with the prior art ventilated power semiconductor module of FIGS. 1 and 2, failure and ultimately an explosion, would occur within one hour of exposure to this condensation-causing environment. In contrast, the present invention operated for over two weeks without failure. These tests were conducted in condensation-causing environments far beyond those which the normal power semiconductor module would be exposed. Tests further proved that the negative effects to the IGBTs caused by the airtight environment of the control electronics was relatively minimal Ultimately, it was found that the long life within the condensation-causing environment far outweighed the small detrimental effects caused by the lack of ventilation to the IGBTs. Ultimately, it is believed that the power semiconductor module 40 of the present invention would have a life expectancy of approximately 20 years as opposed to the 4-5 year life expectancy of the prior art power semiconductor module of FIGS. 1 and 2.

The present invention is also a method for forming the power semiconductor module. In this method, the power semiconductor module is removed from the original shipping container and placed into an environmental chamber. These power semiconductor modules are baked at 60° C. and less than 10% relative humidity for eight hours. After the time has a lapsed, the temperature is reduced to 25° but maintained at less than 10% relative humidity until the power semiconductor module is cool enough to handle. The power semiconductor module is then removed from the environmental chamber immediately before sealing.

Small pieces of silicone rubber sheet are cut is assigned to a size of approximately 8 mm×4 mm. These can then be placed in the holes 62 located on the lid 50.

Approximately one third of a 3.5 ounce tube of Permatex™ (i.e. silicone) is loaded into a syringe. A wiper is used to consolidate the Permatex at the bottom of the syringe. A pneumatic tube is fit to the neck of the syringe and twisted to lock. An air supply is provided so as to provide pressure of up to 12 p.s.i. to the syringe. The sealant material is then applied to each joint that needs to be sealed.

Initially, the AC side heatsink mountings are sealed with the sealant material. This would be the sealant material 76 shown in the previous figures. The sealant should be applied deep into the corners so as to eventually join with another seal during the process. The seal is applied to three locations (such as shown in FIG. 5). The plugs 72 adjacent to the AC busbars 46 are then sealed. The voids between the AC busbars and the plugs are filled completely. Care should be exerted so as to not overflow too much onto the busbars. This sealant will occur in eight locations between the plug 72 and each of the AC busbars 46.

The various holes in the lid 50 are then filled with the sealant material. A swirling motion is used to cover the unplugged holes. Ultimately, the sealant material provides a "cap" for the holes. The plugs in the hole 62 are also covered with the sealant material so as to maintain these plugs in place.

The sealant material is then used on the connector 68. The gap between the connector 68 and the lid 50 is then sealed. Care should be exerted so as to avoid getting the sealant material inside the connector body or into the threads of the retaining threads. The plugs or shuttles 72 on the AC side should then be sealed. In other words, the sealant material is applied entirely around the periphery of each of these plugs away from the AC busbars. The sealant material should then be used so seal along the edge of each of the busbars 46.

The sealant material is then used to seal the DC busbars. This arrangement is shown in FIG. 3. The sealant will extend between the housing 46 and the heatsink 54 and over each of the DC busbars 48. The sealant is then used to seal the heatsinks to the base plate 42. The gaps between the individual bays is also filled with the sealant. The sealant is then applied to the base of each of the supports of the AC busbar and the base plate. As such, this will be the sealant 56 (as shown in FIG. 3). The bead of sealant then will extend around the entire base of the housing and the base plate. The lid 50 is then sealed with the sealant in the area around the periphery of the lid and the top of the housing.

In the present invention, a small vacuum can be applied to the interior of the power semiconductor module. This can be carried out by removing a screw in the lid 50 so as to allow access to the interior of the power semiconductor module. A vacuum hose can then be introduced through the screw hole and into the interior of the power semiconductor module. A small vacuum can then be applied through the vacuum hose so that less than one p.s.i. of pressure resides within the interior of the housing. It is believed that this vacuum will further facilitate the ability for the sealant material to flow into those spaces between each of the components and to further create an air-tight seal between the various components of the power semiconductor module.

Following the application of the sealant, pressure can be applied to the interior of the power semiconductor module in order to determine whether there any leaks. If any leaks occur, then further sealant can be applied in the area of the leaks. If there are no leaks, then the pressurizing hose is removed. The pressurized air is allowed to evacuate from the interior of the power semiconductor module, and then the hole through which the pressure is applied can be sealed.

In the present invention, since there is no possibility for condensation on the interior of the power semiconductor module, there would never be the need to carry out the baking activities of the prior art in order to remove such condensation. As such, the downtime for the power semiconductor module is significantly reduced. Since there is no condensation that can occur, there is no possibility of damage caused by condensation or that the explosions that could occur as a result of condensation. As such, the present invention greatly improves the safety and reliability of the power semiconductor module.

The foregoing disclosure and description of the invention is illustrative and explanatory thereof. Various changes in the details of the illustrated construction can be made within the scope of the appended claims without departing from the true spirit of the invention. The present invention should only be limited by the following claims and their legal equivalents.

I claim:

1. A power semiconductor module comprising:
   a base plate;
   a housing affixed to said base plate,
   said housing having a lid affixed to a top thereof,
   the lid having a plurality of holes formed therein so as to open to an interior of said housing;
   a DC busbar affixed to said base plate and to said housing, said DC busbar having a plurality of bays formed therein;
   an AC busbar affixed to said base plate and to said housing on a side of said housing opposite to said DC busbar;
   control electronics positioned in an interior of said housing and connected to said DC busbar and to said AC busbar;
   a sealant material applied to seams between said base plate and said housing and to seams between said DC busbar and said housing and said base plate,
   and to seams between said AC busbar and said housing and said base plate,
   said sealant material being applied such that said control electronics are in an aft-tight environment within said housing,
   said sealant material affixed so as to seal a seam between the lid and said housing,
   said sealant material closing the plurality of holes of the lid,
   said sealant material closing said plurality of bays;
   a heatsink mounting affixed to said AC busbar,
   said sealant material applied to said AC busbar,
   said sealant material applied to a seam between said heatsink mounting and said AC busbar;
   a plurality of plugs affixed to said housing adjacent to said AC busbar,
   said sealant material applied to seams between said plurality of plugs of said housing;
   a connector affixed to a top of said housing and connected to said control electronics, said sealant material applied to a seam between said connector and said housing,
said sealant material being a silicone material.

* * * * *

UNITED STATES PATENT AND TRADEMARK OFFICE
CERTIFICATE OF CORRECTION

| | |
|---|---|
| PATENT NO. | : 10,959,342 B2 |
| APPLICATION NO. | : 16/377637 |
| DATED | : March 23, 2021 |
| INVENTOR(S) | : Williams et al. |

It is certified that error appears in the above-identified patent and that said Letters Patent is hereby corrected as shown below:

On the Title Page

Item (12) "Williams" is corrected to read --Williams et al.--.

Item (72) Inventor is corrected to read:
--Kevin R. Williams, Waller, TX (US);
Gary Pace, Leander, TX (US)--.

Signed and Sealed this
Fourteenth Day of June, 2022

Katherine Kelly Vidal
*Director of the United States Patent and Trademark Office*